(12) United States Patent
Varghese et al.

(10) Patent No.: US 7,282,640 B2
(45) Date of Patent: Oct. 16, 2007

(54) ELECTRONIC DEVICE HOUSING AND SYSTEMS AND METHODS FOR FORMING SAME

(75) Inventors: Paily T. Varghese, Houston, TX (US); Robert J. Hastings, Spring, TX (US); Thomas A. Kay, Jr., Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 12 days.

(21) Appl. No.: 10/807,628

(22) Filed: Mar. 23, 2004

(65) Prior Publication Data

US 2005/0211456 A1    Sep. 29, 2005

(51) Int. Cl.
*H02G 3/08* (2006.01)

(52) U.S. Cl. ............... 174/50; 174/520; 361/679; 312/223.1

(58) Field of Classification Search .......... 174/50, 174/52.1, 61, 17 R, 53, 58, 57, 520; 312/223.1, 312/22, 265.5, 265.4; 361/679, 683, 600, 361/601, 730, 724, 752, 796; 220/3.2
See application file for complete search history.

(56) References Cited

U.S. PATENT DOCUMENTS

| | | | | |
|---|---|---|---|---|
| 5,165,770 A | * | 11/1992 | Hahn ................ | 312/265.4 |
| 5,441,337 A | * | 8/1995 | Mazura et al. ..... | 312/265.5 |
| 5,574,251 A | * | 11/1996 | Sevier .............. | 174/50 |

\* cited by examiner

*Primary Examiner*—Angel R. Estrada

(57) ABSTRACT

The described embodiments relate to electronic devices. One exemplary device includes a pair of sidewall components extending between respective top portions and bottom portions, the bottom portions lying in a plane that extends between the bottom portions. The device also includes a bottom component joined with and extending between the bottom portions, wherein the bottom component has a non-loaded disposition relative to the plane and a loaded disposition relative to the plane, and wherein at least a portion of the bottom component is closer to the plane in the loaded disposition than in the non-loaded disposition.

20 Claims, 9 Drawing Sheets

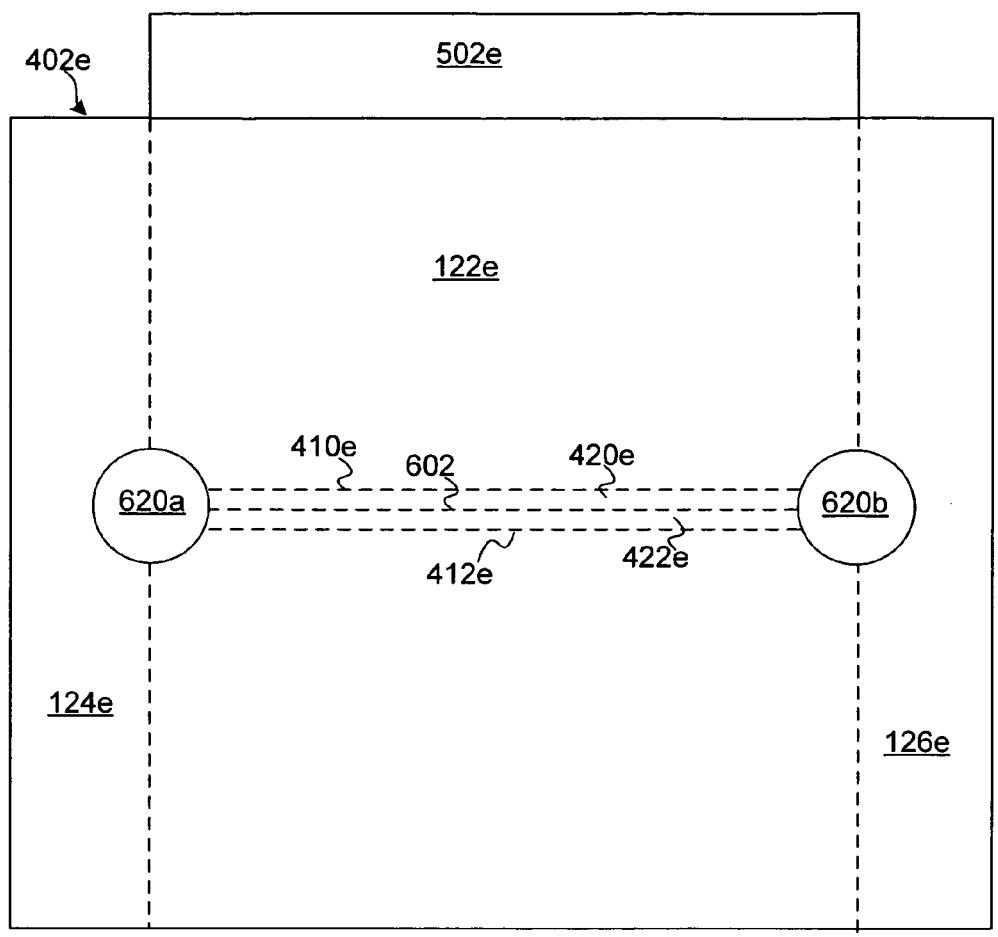
Fig. 6a
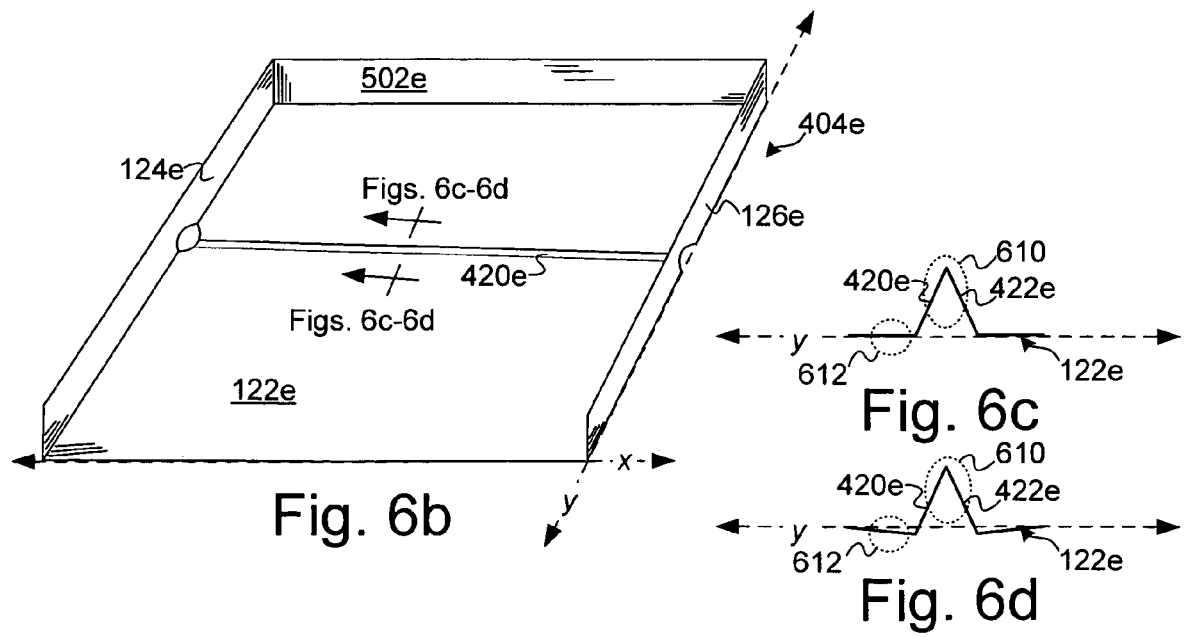
Fig. 6b
Fig. 6c
Fig. 6d

US 7,282,640 B2

ELECTRONIC DEVICE HOUSING AND SYSTEMS AND METHODS FOR FORMING SAME

BACKGROUND

Electronic devices such as personal computers, servers, and digital versatile disks (DVD) players are ubiquitous in everyday life. Electronic devices can employ a housing which can define an internal volume. Various electrical components, such as processors, can be supported by the housing within the internal volume.

FIGS. 1a-1b illustrate an example of an electronic device. FIG. 1a represents a front elevational view, while FIG. 1b illustrates a perspective view. In this particular example electronic device 100 comprises a server. Electronic device 100 can comprise a housing 110. The housing can have a top component 120, a bottom component 122, first and second sidewall components 124, 126, a front component 128 and a back component, which is not specifically illustrated in these views but which can generally oppose front component 128. Sidewall components 124, 126 may extend between a top portion 134, 136 respectively which intersects top component 120, and bottom portion 138, 140 respectively which intersects bottom component 122. In these illustrated embodiments, electronic device 100 has a width w which extends between sidewall components 124, 126 and generally parallel to the x-axis, a length l which extends between front component 122 and the back component and lies generally parallel the y-axis, and a height h which extends between top component 120 and bottom component 122 and which lies generally parallel the z-axis.

FIGS. 2a-2c illustrate cross-sectional representations taken along the xz-plane as indicated in FIG. 1b. FIG. 2a illustrates housing 110 prior to loading electrical components. FIG. 2b illustrates several electrical components 202a-202d within housing 110. Examples of electrical components can include, but is not limited to, processors, read only memory (ROM), random access memory (RAM), transformers, among others, and/or an assortment of such components.

In this particular embodiment bottom component 122 is supported by feet or pads 206a, 206b which are configured to be positioned against a supporting surface 208 which is not a component of electronic device 100.

FIG. 2b illustrates electronic device 100 with electrical components 202a, 202b, 202c, and 202d positioned on and supported by bottom component 122. The weight of electrical components 202a-202d can cause at least a portion of bottom component 122 to distend or sag below the xy-plane and away from top component 120. In this instance the portion of bottom component 122 extending between pads 206a, 206b is sagging relative to the xy-plane. Sagging can become more pronounced with increasing electrical component densities and/or weight within a housing.

FIG. 2c-2d illustrate an alternative configuration where electronic device 100 is supported on bottom component 122 proximate the sidewall bottom portions 138, 140. FIG. 2c illustrates a cross-sectional view similar to that illustrated in FIG. 2b. FIG. 2d illustrates a front elevational representation of a rack 230 configured to support multiple electronic devices. In this particular instance electronic device 100 can be supported by two supports 232, 234 which extend from generally opposing directions under a portion of bottom component 122. As illustrated in FIG. 2d, support 234 extends generally horizontally from a vertical structural member 240 of rack 230.

In the configuration illustrated in FIGS. 2c-2d, the electrical components 202a-202d may cause a portion of bottom component 122, to sag from the generally planar configuration illustrated in FIG. 2a to below the xy-plane. In this instance the portion of bottom component 122 extending between supports 232, 234 is sagging in a direction opposite top component 120 and below the xy-plane.

Sagging of an electronic device's housing can limit design parameters related to the electronic device and/or racks associated with the electronic device. For example, sagging of bottom component 122 may prevent insertion of electronic device 100 into rack 230 if such sagging causes a height dimension $h_1$ to exceed the allocated height dimension $h_2$ of rack 230.

BRIEF DESCRIPTION OF THE DRAWINGS

The same numbers are used throughout the drawings to reference like features and components wherever feasible.

FIGS. 4b-4f illustrate cross-sectional views of a portion of the exemplary electronic device illustrated in FIG. 4a.

FIG. 6a illustrates a top view of an exemplary electronic device in accordance with one embodiment.

FIG. 6b illustrates a perspective view of a portion of an exemplary electronic device in accordance with one embodiment.

FIGS. 6c-6d illustrate cross-sectional views of a portion of the exemplary electronic device illustrated in FIG. 6b.

DETAILED DESCRIPTION

Overview

The following relates to electronic devices and housings of electronic devices. The housing comprises a bottom component joined with other components which can include sidewall components, and front wall and back wall components. When in use, electrical components can be placed in the housing and rest on the bottom component. The housing, and in particular the bottom component, can have a non-loaded disposition which, when loaded assumes a different disposition that mitigates sagging due to the weight of the electrical components contained therein.

EXEMPLARY EMBODIMENTS

Figure 1A:
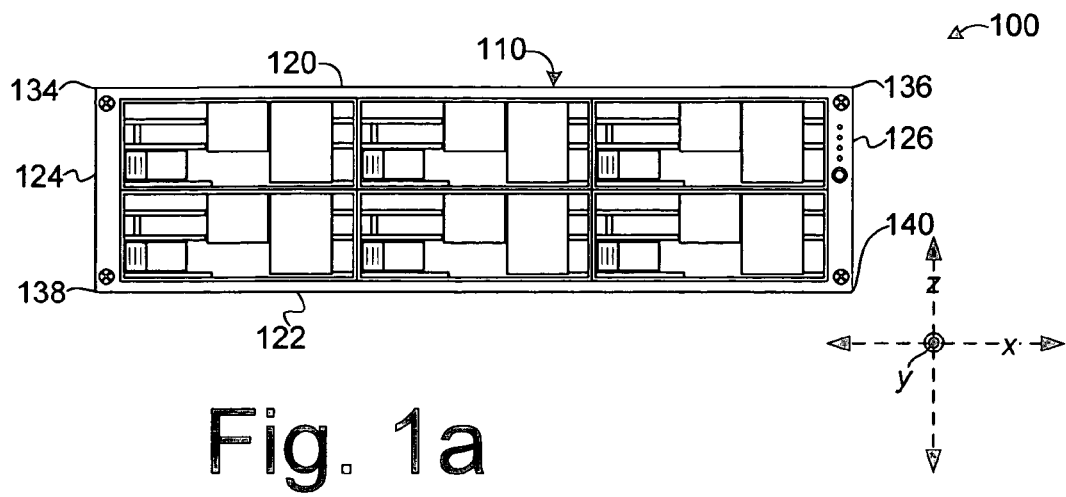
FIG. 1a illustrates a front elevation view of a prior art electronic device.
Figure 1B:
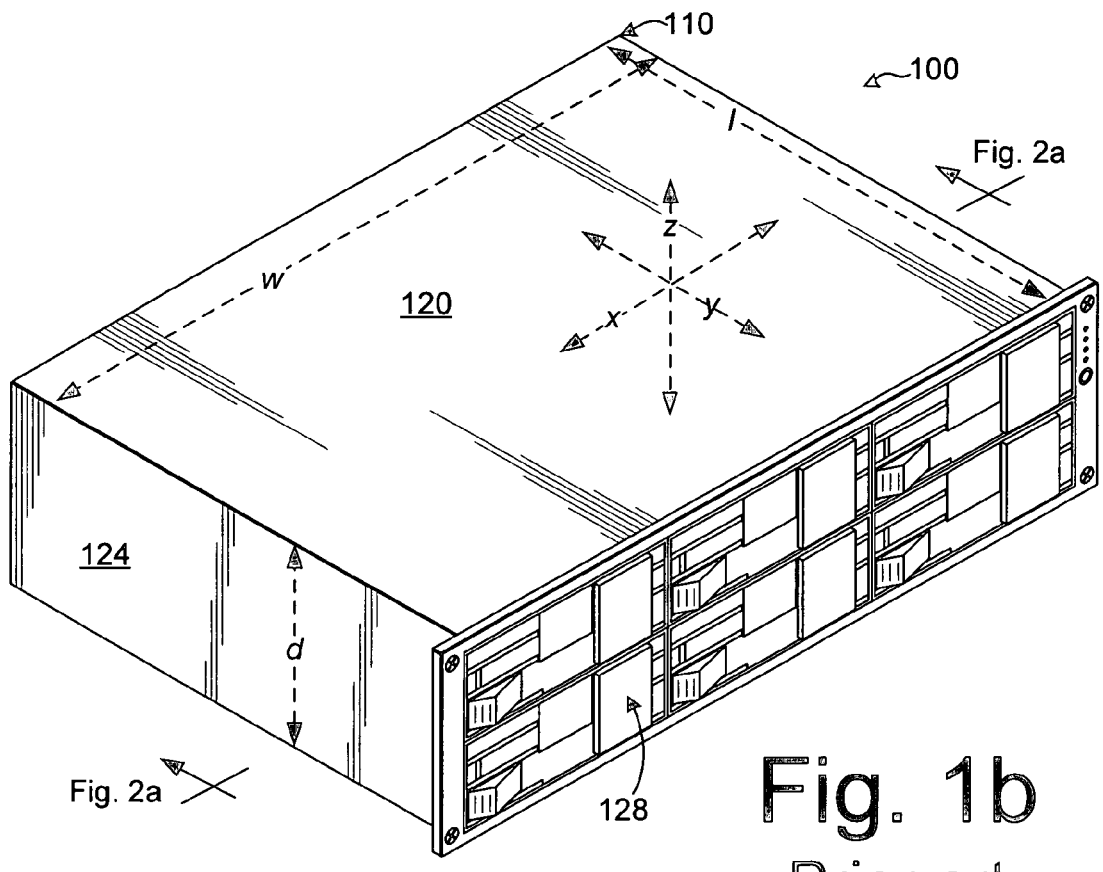
FIG. 1b illustrates a perspective view of a prior art electronic device.
Figure 2A:
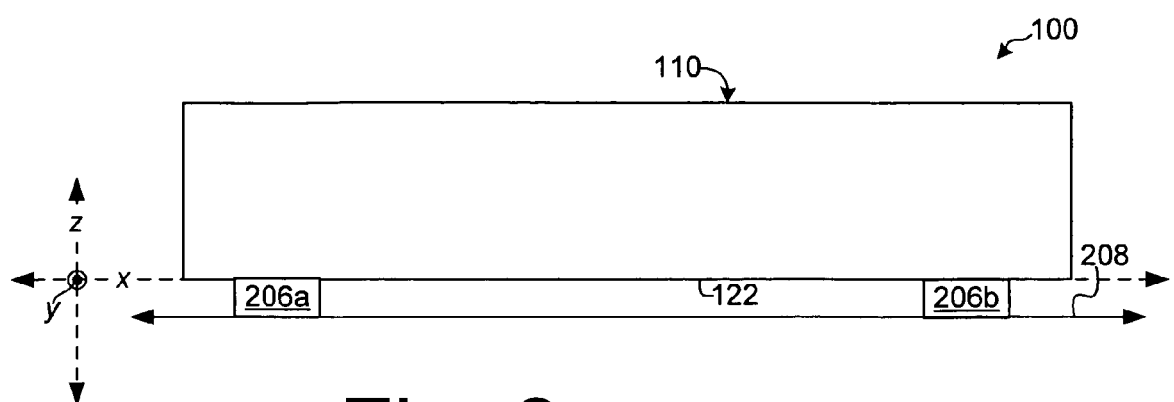
FIGS. 2a-2c illustrate cross-sectional views of a prior art electronic device.
Figure 2B:
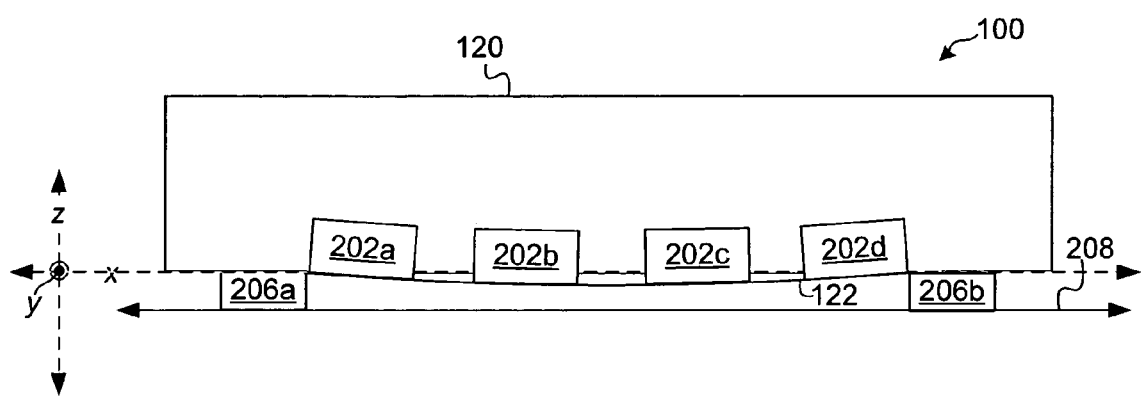
Figure 2C:
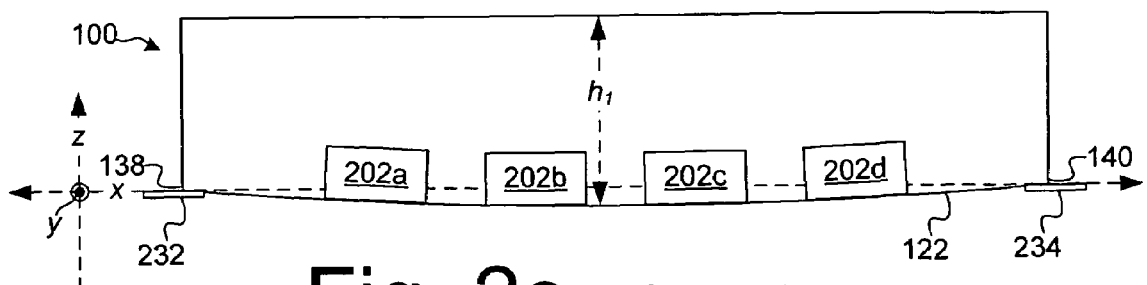
Figure 2D:
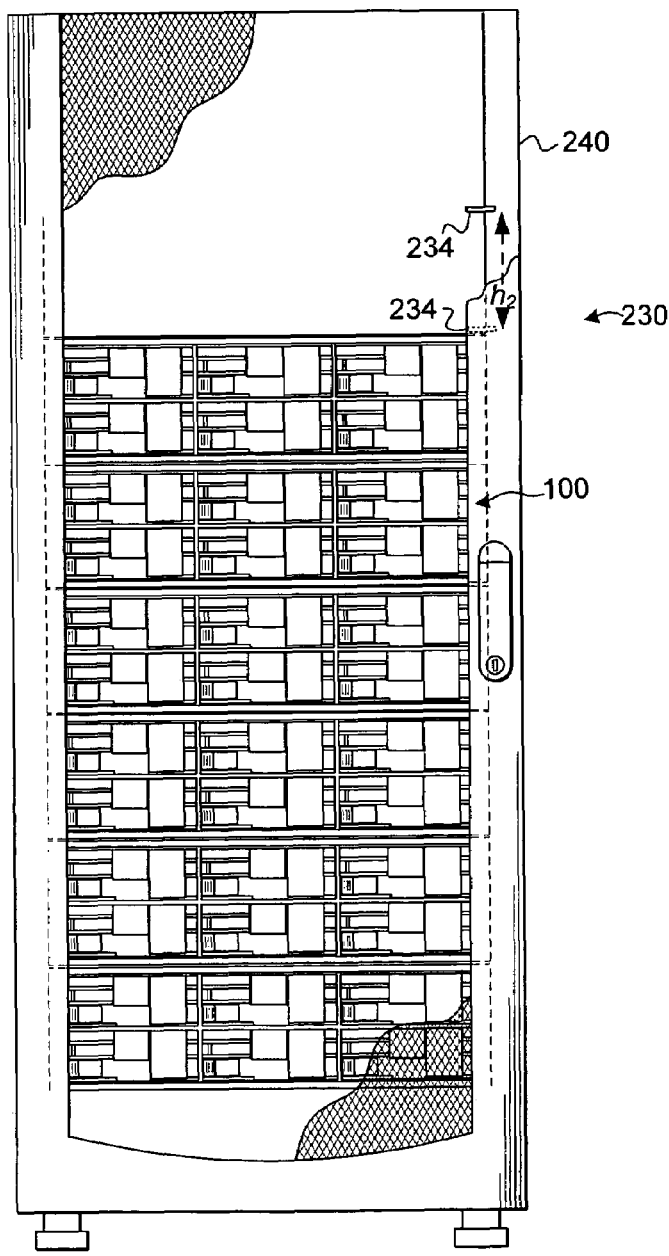
FIG. 2d illustrates a front elevational view of a prior art rack.
Figure 3A:
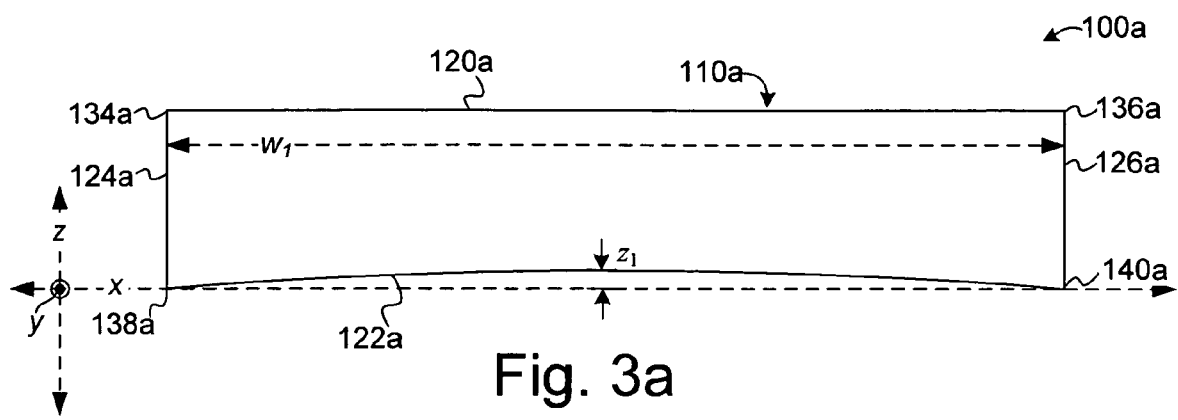
FIGS. 3a-3d illustrate cross-sectional views of a portion of an exemplary electronic device in accordance with one embodiment.
Figure 3B:
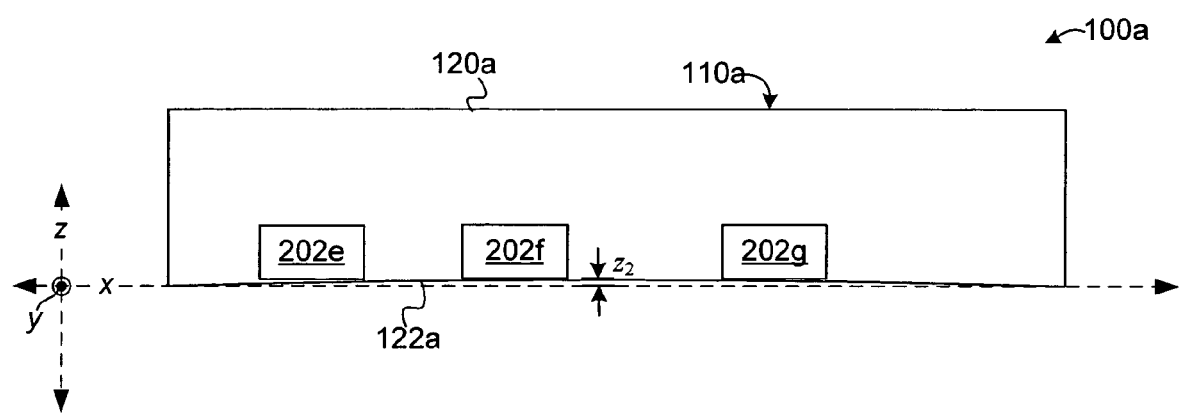
Figure 3C:
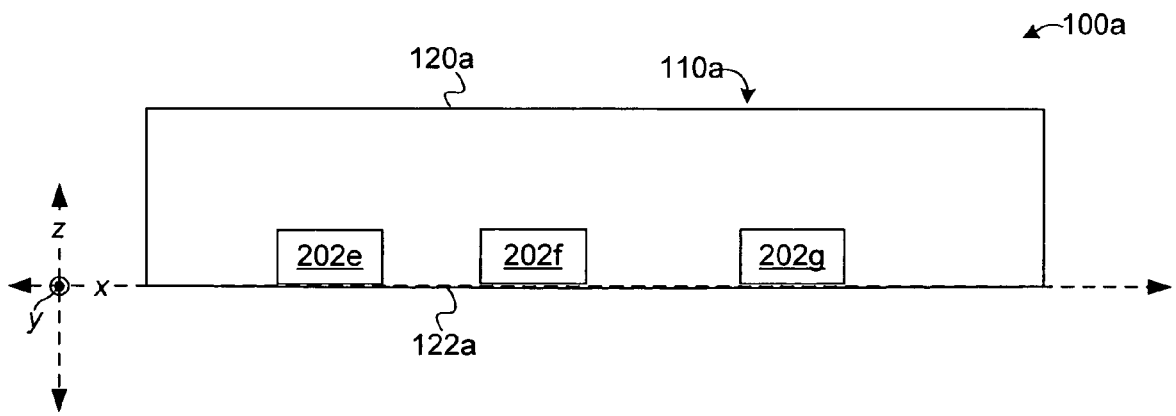
Figure 3D:
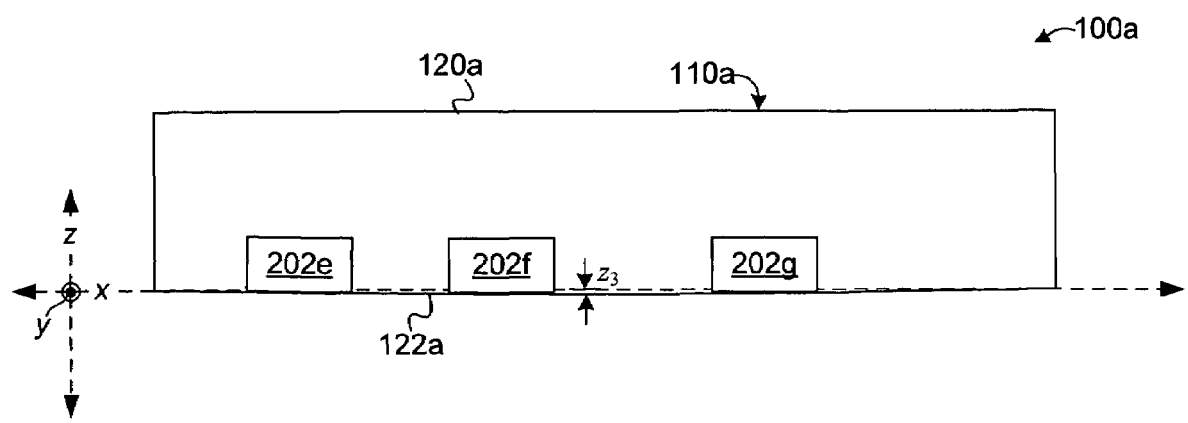

FIGS. 3a-3d illustrate cross-sectional views of an exemplary electronic device 100a which can be less prone to sagging than existing designs. These cross-sectional views are taken generally parallel to the front surface of the electronic device as illustrated in relation to FIGS. 1a-1b and, as such, are similar to the views represented in FIGS. 2a-2c. FIG. 3a illustrates a first or non-loaded configuration of electronic device 100a. FIGS. 3b-3d illustrate three examples of a second or loaded configuration where electrical components are positioned in the electronic device.

Electronic device 100a comprises housing 110a. The housing can comprise top component 120a and bottom component 122a. A pair of sidewall components 124a, 126a extend between the top and bottom components 120a, 122a respectively. In this embodiment top component 120a intersects the sidewall components at top portions 134a, 136a, while bottom component 122a intersects the sidewall components at bottom portions 138a, 140a. The intersection of the bottom component and a sidewall component can define an edge of the bottom component. The bottom portions 138a, 140a can be contained in a plane extending therebetween. In this particular embodiment the plane containing the bottom portions comprises the xy-plane.

As can best be appreciated from FIG. 3a, in the non-loaded configuration of housing 110a, at least a portion of bottom component 122a is deflected away from the xy-plane. In this embodiment essentially the entire bottom component 122a extending between sidewall components 124a, 126a is deflected toward top component 120a. Other exemplary configurations, examples of which are provided below, may deflect less of the bottom component.

In this particular embodiment bottom component 122a is deflected upwardly toward the top component 120a in a generally arcuate configuration that is concave away from top component 120a. Examples of some other exemplary configurations are provided below. An extent of the bottom component's deflection toward top component is indicated generally here as distance $z_1$ which is measured generally parallel to the z-axis. Distance $z_1$ can have a wide range of values depending on various factors including but not limited to the width $w_1$ of housing 110a, the weight of the electrical components to be positioned within the housing, and the material selected for the housing.

With present technologies, electronic devices such as servers can have a width in the range of 10 to 30 inches, though other electronic devices reside above and below this range. In some of these embodiments, distance $z_1$ can range from 0.001 inch to 0.300 or more. In some exemplary configurations, with a housing width $w_1$ of 15-20 inches, distance $z_1$ can have a value in a range of 0.002 to 0.020. The skilled artisan should recognize other exemplary configurations.

FIG. 3b illustrates a representation of electrical device 100a in the loaded configuration where electrical components 202e, 202f, and 202g are positioned in housing 110a. In this embodiment, the three electrical components 202e-202g are positioned in housing 110a on bottom component 122a. Other exemplary configurations may have more or less electrical components positioned in housing 110a. In this embodiment, in the loaded configuration, bottom component 122a is deflected toward the xy-plane by the weight of electrical components 202e-202g. As such, the bottom component's deflection away from the xy-plane, as measured generally parallel to the z-axis and indicated generally as $z_2$, is less in the loaded configuration than in the non-loaded configuration illustrated in FIG. 3a.

FIGS. 3c-3d illustrate two alternative loaded conditions of housing 110a. FIG. 3c illustrates an alternative configuration where the loaded configuration causes bottom component 122a generally to lie in the xy-plane. FIG. 3d illustrates an alternative exemplary configuration where the loaded configuration causes bottom component 122a generally to extend past the xy-plane to a position on the opposite side of the xy-plane as top component 120a. In this instance the deflection of bottom component as measured generally parallel the z-axis is indicated generally as $z_3$. In this particular embodiment loaded deflection $Z_3$ below the xy-plane is less than $z_1$ above the xy-plane. Each of the embodiments represented in FIGS. 3b-3d represent embodiments where the housing's bottom component is more proximate the xy-plane in the loaded configuration than in the non-loaded configuration.

Figure 4A:
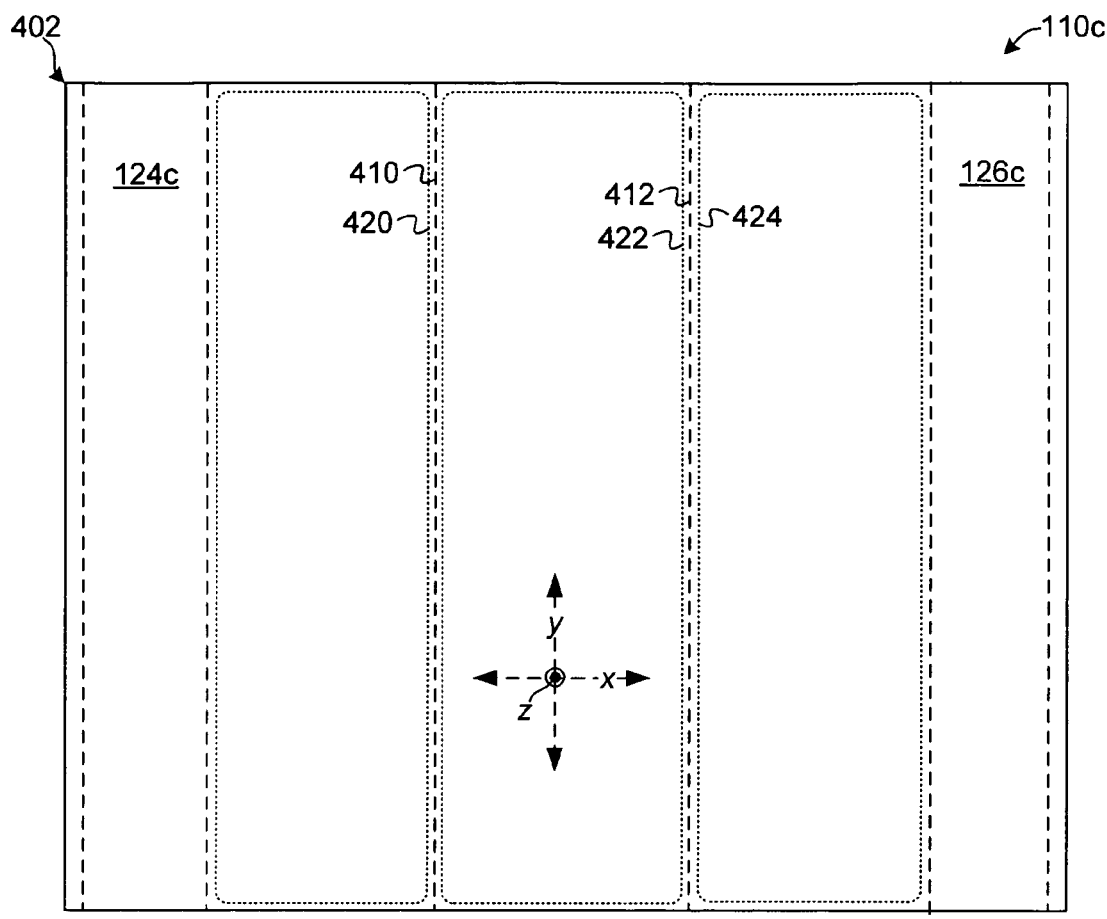
FIG. 4a illustrates a top view of an exemplary electronic device in accordance with one embodiment.

FIGS. 4a-4f illustrate another exemplary electronic device and process steps for forming same. FIG. 4a represents a top view while FIGS. 4b-4f represent cross-sectional views.

Figure 4B:
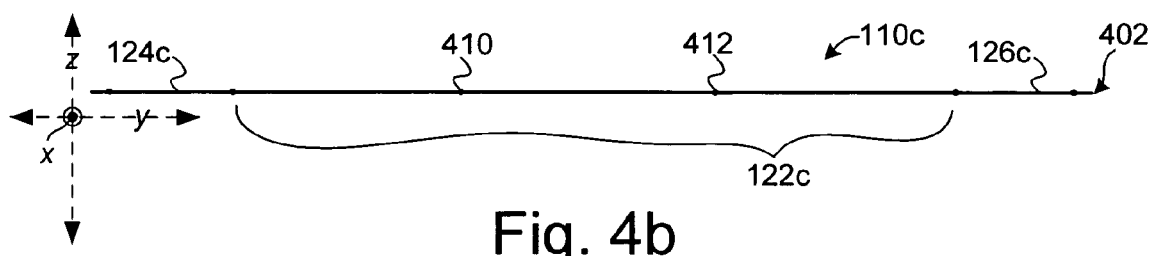
Figure 4C:
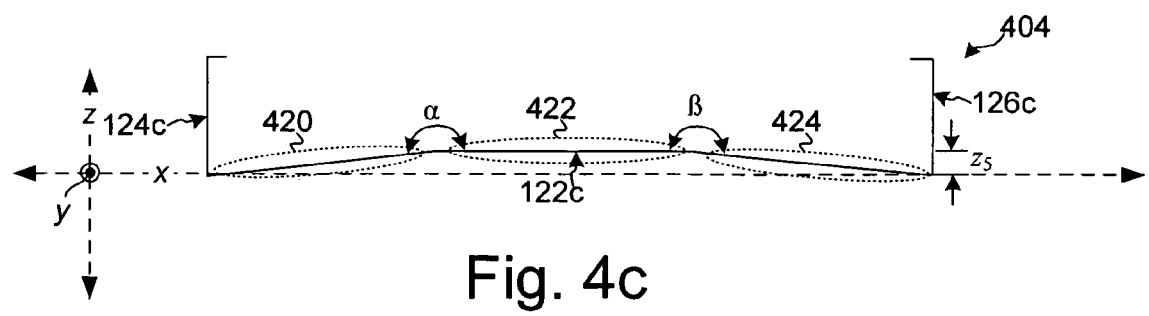

Referring to FIGS. 4a-4c, material 402 is processed to form a base pan 404. A base pan can comprise a bottom component and one or more adjacent components such as sidewall component(s), front wall component, and back wall component. In this particular embodiment, base pan 404 comprises bottom component 122c and sidewall components 124c, 126c.

Any suitable material can be utilized to form base pan 404. In this particular embodiment, material 402 can comprise sheet metal of a gauge and composition employed in the art. Other materials such as polymers and/or other metals can also be utilized either alone or combination with sheet metal materials to form some or all of the housing components.

FIGS. 4a-4b illustrate material 402 with areas designated to be formed into associated components including bottom component 122c and sidewall components 124c, 126c of housing 110c. Regions of bottom component 122b can be manipulated to define portions of the bottom component. In this embodiment two regions 410, 412 of bottom component 122b can be manipulated to define first, second, and third portions 420, 422, and 424 of the bottom component.

FIG. 4c illustrates base pan 404 formed by manipulating material 402 utilizing known sheet metal manipulation tools and processes such as bending and/or crimping. In some embodiments the sheet metal can be manipulated along regions 410, 412 to form an angle between the various portions 420-424. In this particular embodiment angle α is formed between first portion 420 and second portion 422. Angle β is formed between second portion 422 and third portion 424. In some embodiments angles α, β can have a value greater than 180 degrees. Some of these embodiments may utilize angles in a range of about 180.2 degrees to about 185 degrees. Other embodiments may have still larger angles α, β. For ease of describing and illustrating this embodiment, angles α, 62 represented in FIG. 4c, as well as other angles in other drawings described above and below may not accurately represent the angles described in the text. In some instances the angle may be exaggerated in the illustrations to aid in explaining a related embodiment.

FIG. 4c represents the non-loaded configuration of bottom component 122c. In this particular embodiment, manipulated regions 410, 412 cause second portion 422 to be displaced to the same side of the xy-plane as the sidewall components 124c, 126c occur. This displacement can be evidenced by distance $z_5$.

Figure 4D:
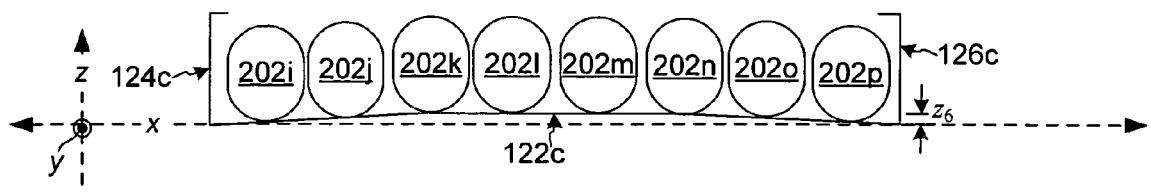
Figure 4E:
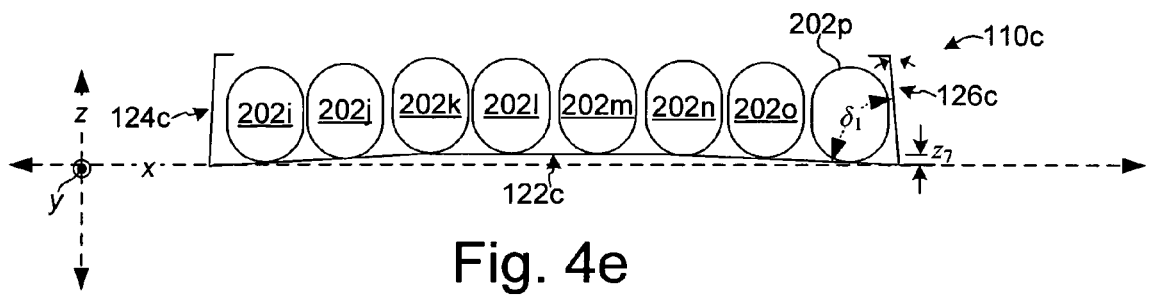

Referring collectively to FIGS. 4d-4e, base pan 404 is loaded with multiple electrical components 202i-202p that can cause the base pan to assume the loaded configuration. FIG. 4d illustrates an exemplary loaded configuration where the weight of the electrical components causes the bottom component's second portion to be deflected toward the xy-plane. In this embodiment in the loaded configuration second portion 422 is more proximate the xy-plane than the non-loaded configuration depicted in FIG. 4c as can be evidenced by distance $z_6$ which is less than distance $z_5$.

FIG. 4e illustrates an alternative loaded configuration where the weight of electrical components 202i-202p can cause second portion 122 to deflect toward the xy-plane when compared to the non-loaded configuration. This displacement can be evidenced by comparing distance $z_7$ to the greater value of $z_5$. In this embodiment, the weight of electrical components 202i-202p can also cause top portions 134c, 136c of sidewalls 124c, 126c to deflect toward bottom component 122c forming an acute angle relative to bottom component 122c. Angle $\delta_1$ is illustrated between bottom component 122c and sidewall component 126c. In this particular embodiment, angle $\delta_1$ is about 88 degrees. Other embodiments may have angles ranging from less than 80 degrees to more than 89.5 degrees. FIG. 4e represents a first or unassembled flexure disposition of housing 110c.

FIGS. 4d-4e represents an exemplary housing which is loaded with electrical components but is unassembled or only partially assembled. In this instance the housing's top portion has yet to be joined with base pan 404. Further process steps to assemble housing 110c are described below.

Figure 4F:
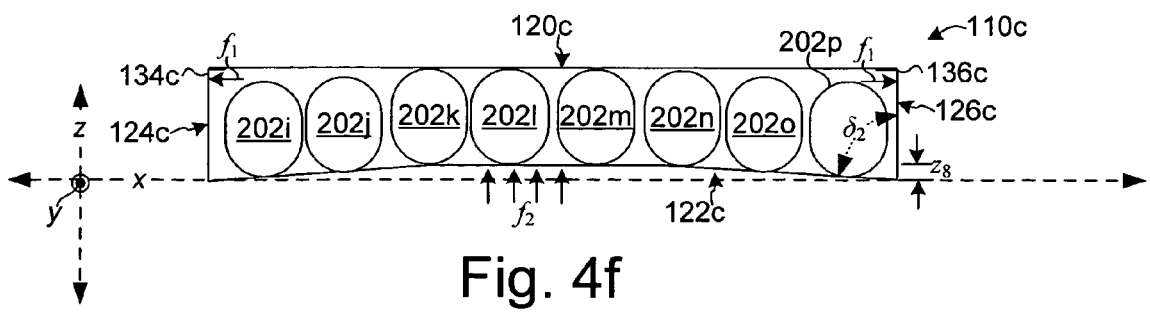
Figure 5A:
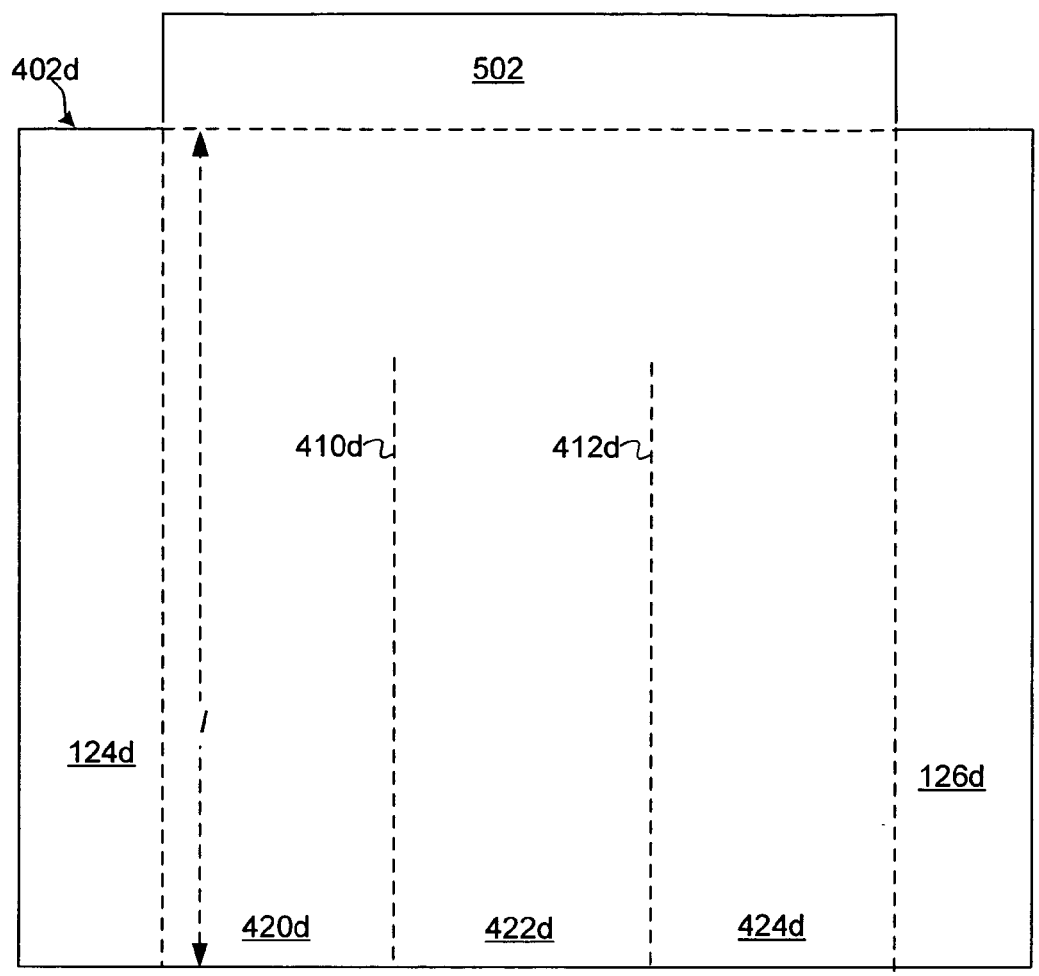
FIG. 5a illustrates a top view of an exemplary electronic device in accordance with one embodiment.
Figure 5B:
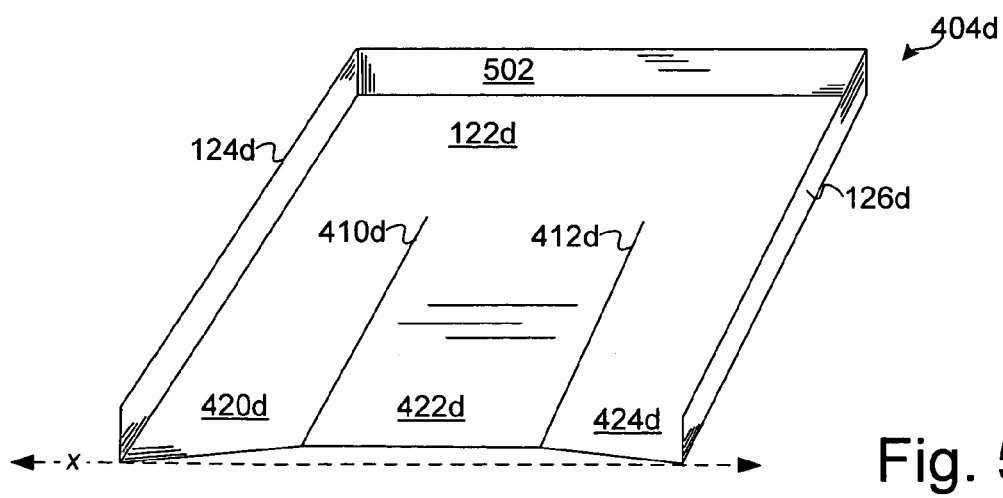
FIG. 5b illustrates a perspective view of a portion of an exemplary electronic device in accordance with one embodiment.

Referring to FIGS. 4e-4f, top component 120c is secured to base pan 404 to achieve a second or assembled flexure disposition of housing 110c as evidenced in FIG. 4f. In this instance, force as indicated generally by arrows $f_1$, is applied to sidewall components 124c, 126c so that the sidewall components extend generally parallel to the z-axis. Top component 120c can then be secured to upper portions 134c, 136c to maintain the orientation of the sidewalls. Forcing the sidewall portions outward can create an upward force $f_2$ on bottom component 122c. This upward force $f_2$ can cause portions of bottom component 122c to be more upwardly disposed in the assembled configuration evidenced in FIG. 4f than in the unassembled configuration evidenced in FIG. 4e. This upward disposition can be evidenced from distance $z_8$ which is greater than distance $z_7$. In this embodiment illustrated in FIGS. 4e-4f, the housing's assembled flexure disposition is more flexed than the unassembled flexure disposition. The upward disposition alternatively can be evidenced in that sidewall 126c maintains an acute angle $\delta_2$ relative to bottom component in the assembled configuration. In this instance the angle is about 89 degrees, though other embodiments may range from about 85 degrees to about 90 degrees FIG. 5a-5b illustrate another exemplary base pan 404d. FIG. 5a illustrates a top view of material 402d which can be manipulated into the base pan as illustrated in the perspective view of FIG. 5b.

In this embodiment, bottom pan 404d comprises bottom component 122d, sidewall components 124d, 126d and backside component 502. In this embodiment base pan's bottom component 122d has two regions 410d, 412d that are manipulated to create portions of the bottom component. The two regions 410d, 412d of bottom component 122d can be manipulated to define first, second, and third portions 420d, 422d, and 424d of the bottom component. In this particular embodiment regions 410d, 412d extend less than bottom component's entire length l and can deflect at least some of bottom component 122d away from the x-axis which is provided for reference purposes and is oriented similar to the orientation illustrated in FIGS. 4b-4f. Extending regions 410d, 412d along less than the entire length l may aid in manipulating or bending backside component 502 relative to bottom component 122d.

FIG. 6a-6d illustrate another exemplary base pan 404e. FIG. 6a illustrates a top view of material 402e which can be manipulated into the base pan as illustrated in the perspective view of FIG. 6b. FIGS. 6c and 6d illustrate a slightly enlarged view of a portion of the bottom component illustrated in FIG. 6b in the non-loaded and loaded configurations respectively.

In this embodiment bottom pan 404e comprises bottom component 122e, sidewall components 124e, 126e and backside component 502e. Further, bottom component 122e has three regions 410e, 412e, and 602 that can be manipulated to create two portions 420e, 422e of the bottom component. At least a first area 610 of portions 420e, 422e can be deflected above the xy-plane in the non-loaded configuration as can best be appreciated from FIG. 6c. In this instance the xy-plane passes through the intersection of sidewall components 124e, 126e and back wall component 502e with bottom component 122e. This is but one embodiment where areas of the bottom component deflected above the xy-plane in the non-loaded configuration can contribute to reducing sagging of other or second areas of the bottom component in the loaded confirmation. For example, as illustrated in FIGS. 6c and 6d which illustrate non-loaded and loaded configurations respectively, area 610 of portions 420e, 422e can reduce sagging of second area 612 in the loaded configuration.

In this embodiment, regions 420e, 422e extend generally parallel to back wall 502e. Examples of such regions extending generally parallel to the sidewalls are described above. Still further embodiments may utilize other orientation or combinations of orientations. For example, such regions can extend diagonally from a front corner of the bottom component to an opposing rear corner. The skilled artisan should recognize other embodiments.

In some embodiments portions of material 402e can be removed to aid in manipulation of the various base pan components to one another. For example as evidenced from FIGS. 6a-6b, in this particular embodiment two portions 620a, 620b of material 402e can be removed prior to manipulating the sidewall components 124e, 126e relative to bottom component 122e to aid in the manipulation process. Removing portions 610a, 610b proximate an intersection of regions 420e, 422e and sidewall components 124e, 126e can aid in allowing sidewall components 124e, 126e to be oriented as desired relative to bottom component 122e.

CONCLUSION

The various embodiments described above can mitigate sagging effects caused by loading various housings with electrical components.

Although the inventive concepts have been described in language specific to structural features and/or methodological steps, it is to be understood that the inventive concepts in the appended claims are not limited to the specific features or steps described. Rather, the specific features and steps are disclosed as forms of implementing the inventive concepts.

The invention claimed is:

1. An electronic device housing comprising:
   a pair of sidewall components extending between respective top sidewall portions and bottom sidewall portions, the bottom sidewall portions lying in a plane that extends between the bottom sidewall portions; and,
   a bottom component joined with and extending between the bottom sidewall portions, wherein the bottom component has a non-loaded disposition relative to the plane and a loaded disposition relative to the plane, and wherein at least a portion of the bottom component is closer to the plane in the loaded disposition than in the non-loaded disposition, wherein the portion of the bottom component is juxtaposed with one or more manipulated regions of the bottom component such that the manipulated regions urge the portion away from the plane while the bottom component retains a generally flat profile.

2. The electronic device housing as recited in claim 1, wherein in the non-loaded disposition and in the loaded disposition, at least a majority of the bottom component lies on the same side of the plane.

3. The electronic device housing as recited in claim 1, wherein in the loaded disposition at least a majority of the bottom component is on the same side of the plane as the top portions.

4. The electronic device housing as recited in claim 1, wherein the bottom component and the pair of sidewall components are formed from a single piece of material.

5. The electronic device housing as recited in claim 4, wherein the single piece of material comprises a base pan.

6. The electronic device housing as recited in claim 4, wherein the portion comprises a first portion, wherein prior to attaching a top component, a second portion of the bottom component juxtaposed the sidewall component forms an angle of about 88 degrees relative to the sidewall component.

7. The electronic device housing as recited in claim 4, wherein the portion comprises a first portion, wherein prior to attaching a top component, a second portion of the bottom component juxtaposed the sidewall component forms an angle in the range of about 80 degrees to about 89.5 degrees relative to the sidewall component.

8. The electronic device housing as recited in claim 1, wherein the portion of the bottom component is generally oriented along a length of the bottom component from a front edge but not completely to a back edge.

9. The electronic device housing as recited in claim 1, wherein the portion of the bottom component extends along an entirety of a length of the bottom component from a front edge to a back edge.

10. The electronic device housing as recited in claim 1, wherein the portion of the bottom component is generally oriented along a width of the bottom component between the bottom sidewall portions.

11. The electronic device housing as recited in claim 10 wherein the manipulated regions result in a portion that is a v-shaped portion.

12. The electronic device housing as recited in claim 1, wherein the manipulated regions form shallow bends on each side of the portion.

13. The electronic device housing as recited in claim 12, wherein the manipulated regions form bends having an angle in the range of about 180.2 degrees to about 185 degrees.

14. The electronic device housing as recited in claim 1, wherein the manipulated regions form a gradual arch across the portion.

15. The electronic device housing as recited in claim 1, wherein the bottom component has a width between the bottom sidewall components in the range of 15 inches to about 20 inches and wherein the non-loaded disposition relative to the plane is in the range of 0.002 to 0.020 inches.

16. The electronic device housing as recited in claim 1, wherein the bottom component has a width between the bottom sidewall components in the range of 15 inches to about 20 inches and wherein the non-loaded disposition relative to the plane is in the range of 0.001 to 0.300 inches.

17. The electronic device housing as recited in claim 1, wherein the portion comprises a first portion and wherein a second portion of the bottom component juxtaposed the sidewall component forms an angle of less than 90 degrees relative to the sidewall component.

18. The electronic device housing as recited in claim 1, further comprising a top component joined to the respective sidewall portions, wherein the bottom component has a generally concave shape that is oriented away from the top component.

19. The electronic device housing as recited in claim 18, wherein the concave shape of the bottom component lies an the same side of the plane as the top component.

20. The electronic device housing as recited in claim 1, further comprising electronic components mounted to the bottom component to produce the loaded disposition.

* * * * *

UNITED STATES PATENT AND TRADEMARK OFFICE
CERTIFICATE OF CORRECTION

| | |
|---|---|
| PATENT NO. | : 7,282,640 B2 |
| APPLICATION NO. | : 10/807628 |
| DATED | : October 16, 2007 |
| INVENTOR(S) | : Paily T. Varghese et al. |

It is certified that error appears in the above-identified patent and that said Letters Patent is hereby corrected as shown below:

In column 4, line 50, delete "62" and insert -- β --, therefor.

In column 8, line 38, in Claim 19, delete "an" and insert -- on --, therefor.

Signed and Sealed this

Eighth Day of July, 2008

JON W. DUDAS
*Director of the United States Patent and Trademark Office*